(12) United States Patent
Shen

(10) Patent No.: US 8,044,585 B2
(45) Date of Patent: Oct. 25, 2011

(54) LIGHT EMITTING DIODE WITH BUMPS

(75) Inventor: Ming-Hsien Shen, Taipei Hsien (TW)

(73) Assignee: Chain Technology Consultant Inc., Kaohsiung (TW)

( * ) Notice: Subject to any disclaimer, the term of this patent is extended or adjusted under 35 U.S.C. 154(b) by 696 days.

(21) Appl. No.: 11/415,508

(22) Filed: May 2, 2006

(65) Prior Publication Data

US 2007/0257610 A1    Nov. 8, 2007

(51) Int. Cl.
*H01L 33/00* (2010.01)
*H01J 1/62* (2006.01)

(52) U.S. Cl. ........ 313/512; 313/501; 313/498; 313/110; 257/98; 257/99; 257/100

(58) Field of Classification Search .................... 313/512
See application file for complete search history.

(56) References Cited

U.S. PATENT DOCUMENTS

| | | | | |
|---|---|---|---|---|
| 4,843,280 A * | 6/1989 | Lumbard et al. | | 313/500 |
| 5,485,317 A * | 1/1996 | Perissinotto et al. | | 359/712 |
| 6,755,556 B2 * | 6/2004 | Gasquet et al. | | 362/329 |
| 7,422,347 B2 * | 9/2008 | Miyairi et al. | | 362/335 |
| 7,473,013 B2 * | 1/2009 | Shimada | | 362/327 |
| 2003/0089914 A1 * | 5/2003 | Chen | | 257/79 |
| 2003/0151361 A1 * | 8/2003 | Ishizaka | | 313/512 |
| 2005/0001228 A1 * | 1/2005 | Braune et al. | | 257/99 |

* cited by examiner

*Primary Examiner* — Sikha Roy
(74) *Attorney, Agent, or Firm* — Thomas, Kayden, Horstemeyer & Risley, LLP

(57) ABSTRACT

A light-emitting diode includes a package, a light-emitting diode chip and a lens. The light-emitting diode chip is mounted on the package. The lens is mounted on the package and envelops the light-emitting diode chip, wherein the lens has a plane region surrounding the package and a bumpy region with a plurality of bumps fully arranged thereon adjacent to the plane region.

7 Claims, 4 Drawing Sheets

LIGHT EMITTING DIODE WITH BUMPS

BACKGROUND

1. Field of Invention

The present invention relates to a light emitting diode (LED). More particularly, the present invention relates to a LED having a lens with a patterned surface.

2. Description of Related Art

A LED is a kind of junction diode mainly composed of p type and n type epitaxy layer on the semiconductor substrate. After forming the epitaxy structure, the chip is sliced and then fixed on a panel. Then, the chip is wired and packaged to form the LED. Generally speaking, the material for packaging of the LED is epoxy, polycarbonate (PC), or other polymer that is highly pervious to light. By the transition property of the semiconductor carrier, it emits light corresponding to the wavelength of the energy gap of the material or the energy level of quantum well. Thus forms the light of the LED. Therefore, by adjusting the structure of the material, the LED will emit light of different colors by different current.

The LED is a kind of light source that conserves energy. Although conventional light sources, such as light bulbs, are inexpensive, there are disadvantages, such as low efficiency, high power consumption, short lifespan, and fragility. Fluorescent lamps are less power consuming, but they are fragile and the waste contains mercury that pollutes the environment. The LED has long lifespan, low power consumption, and no mercury. Thus makes the LED an ideal light source. Besides, the LED has a variety of types and applications. Hence, it has already become an essential tool in the modern world.

Reference is made to FIG. 1 which is a schematic diagram of a conventional LED. In FIG. 1, a LED 100 includes a package 110, a light-emitting diode chip 120 and a lens 130. The light-emitting diode chip 120 is mounted on the package 110. The lens 130 is mounted on the package 110 and envelops the light-emitting diode chip 120. Typically, the lens 130 is smooth and curved. Therefore, parts of light 150 produced by the light-emitting diode chip 120 may be reflected to the back of the LED 100 by the lens 130.

The parts of light 150 are unable to light the front of the LED 100 due to the reflection of the lens 130. This will cause the LED 100 has bad light efficiency. That is, a conventional LED has to waste some power on producing the parts of light unable to light the front of the LED. Therefore, the LED is still incapable of being applied to many technique fields, which needs high brightness light sources, at the present day.

SUMMARY

It is therefore an aspect of the present invention to provide a LED with high light efficiency, so that the LED can be applied to many technique fields, which needs high brightness light sources.

In accordance with the foregoing aspect of the present invention, a LED including a package, a light-emitting diode chip and a lens is provided. The light-emitting diode chip is mounted on the package. The lens is mounted on the package and envelops the light-emitting diode chip, wherein the lens has a plane region surrounding the package and a bumpy region with a plurality of bumps fully arranged thereon adjacent to the plane region.

From another aspect of the LED, the bumpy region may be seen as a trench region having a plurality of trenches arranged thereon. In addition, the lens may also be seen as having a plurality of bumps arranged on the lens and facing the inside of the LED. The trenches may be arranged on trench region fully as well. Although parts of light are still reflected by the lens, the parts of light are reflected to the front of the LED due to the bumps or the trenches. Furthermore, because the plane region has higher reflection rate than the bumpy or trench region has, another parts of the light which hit the plane region will be reflected to the front of the LED as well. Accordingly, the brightness of the LED is enhanced.

In conclusion, the LED according to the present invention has excellent light efficiency because the lens of the LED have the bumps or trenches to reflect parts of light to the front of the LED, so the LED according to the present invention can provide higher brightness and save more power than a conventional LED. Therefore, the LED according to the present invention can be applied in many technique fields to replace traditional light sources, ex lamps.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
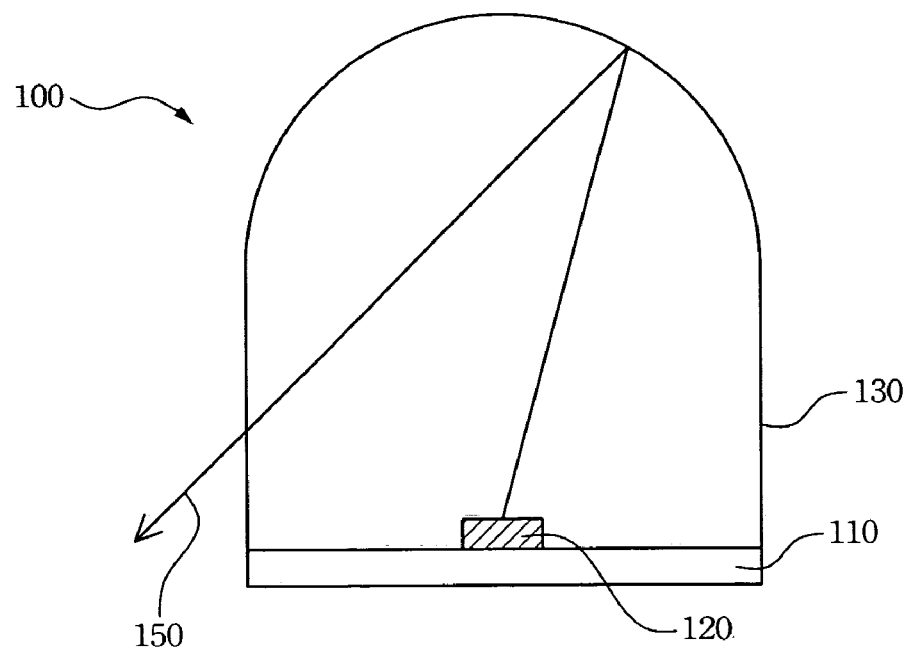
FIG. 1 is a schematic diagram of a conventional LED.

Reference will now be made in detail to the present preferred embodiments of the invention, examples of which are illustrated in the accompanying drawings. Wherever possible, the same reference numbers are used in the drawings and the description to refer to the same or like parts.

Figure 2:
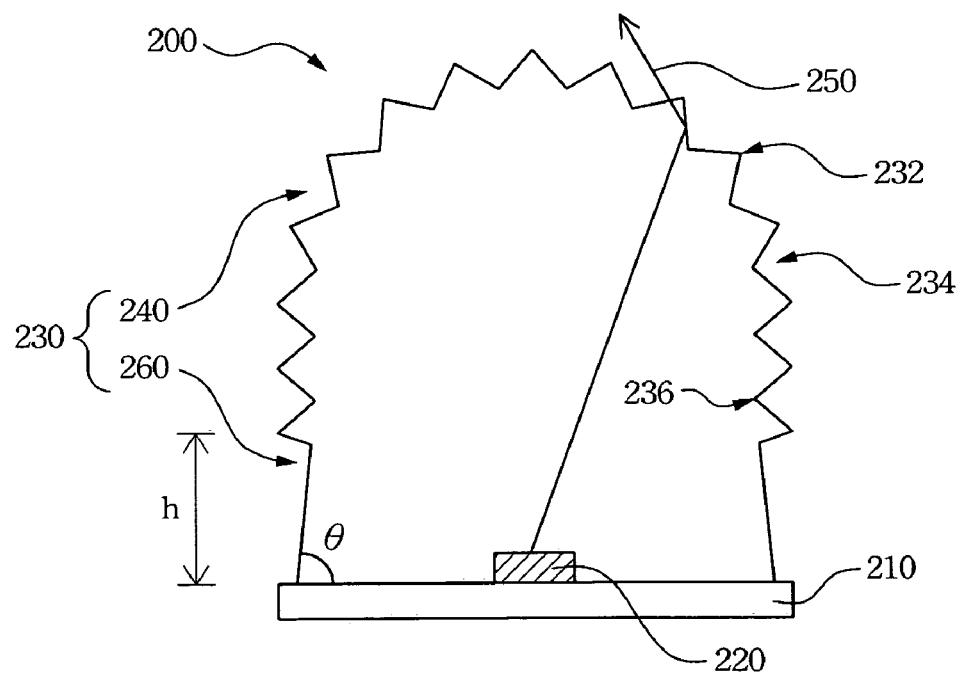
FIG. 2 is a schematic diagram of a LED according to one preferred embodiment of this invention.

Reference is made to FIG. 2, which is a schematic diagram of a LED according to one preferred embodiment of this invention. In FIG. 2, a LED 200 includes a package 210, a light-emitting diode chip 220 and a lens 230. The light-emitting diode chip 220 is mounted on the package 210. The lens 230 is mounted on the package 210 and covers the light-emitting diode chip 220, wherein the lens 230 has a plane region 260 surrounding the package 210 and a bumpy region 240 with a plurality of bumps 232 fully arranged thereon adjacent to the plane region 260. The vertical height h of the plane region 260 may be less than about 10 mm. The plane region 260 is positioned with an angle θ between the plane region 260 and the package 210, and where the angle θ is equal to or less than 90 degrees.

Figure 3A:
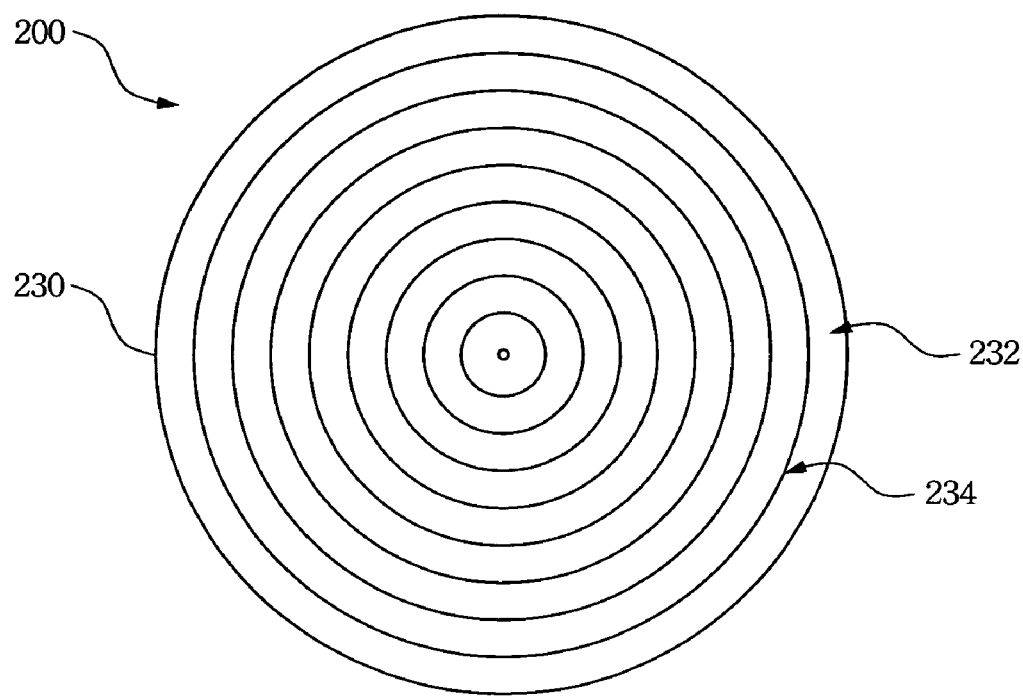
FIG. 3A is a top view of the LED 200 shown in FIG. 2.
Figure 3B:
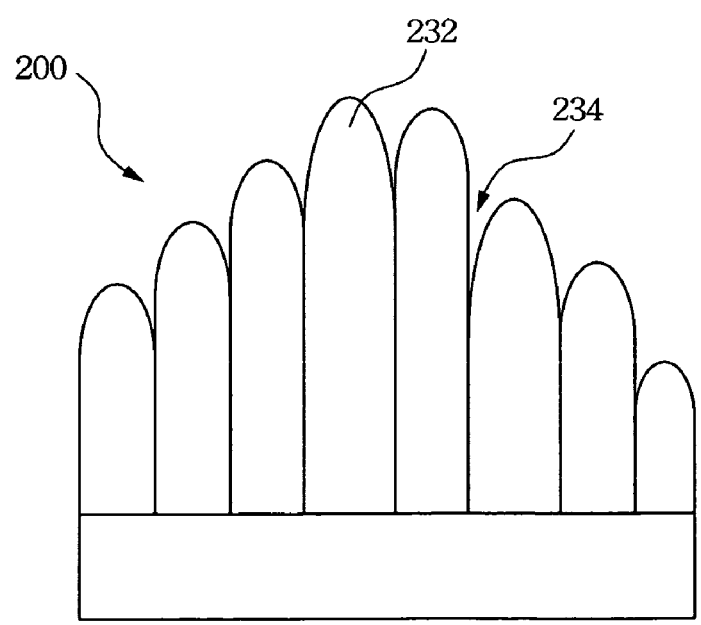
FIG. 3B is a side view of a LED according to another preferred embodiment of this invention.
Figure 4A:
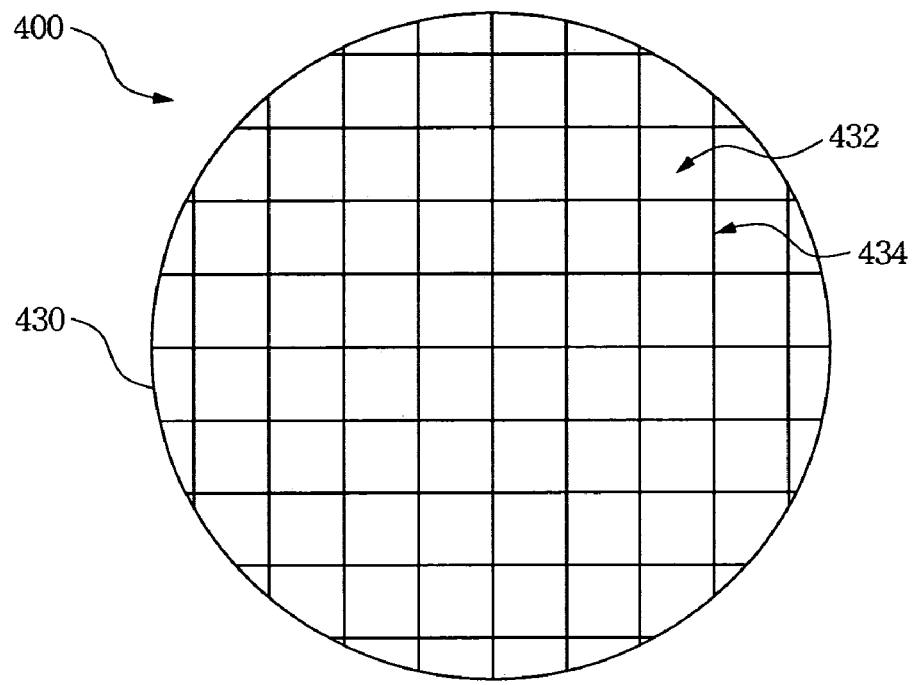
FIG. 4A is a top view of a LED according to still another preferred embodiment of this invention.
Figure 4B:
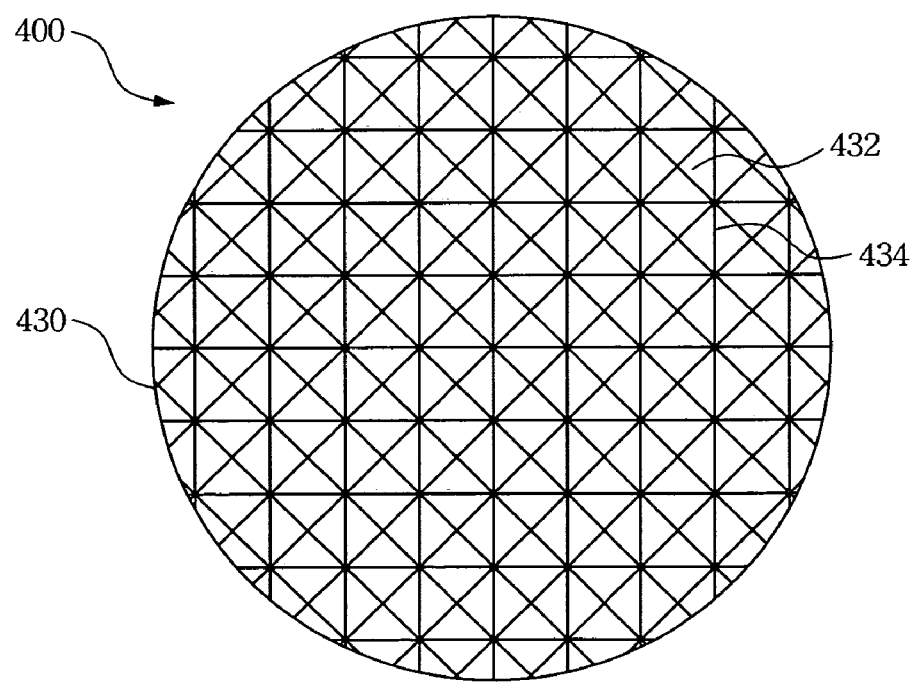
FIG. 4B is a top view of a LED according to yet another preferred embodiment of this invention.

From another aspect of the LED 200, the bumpy region 240 may be seen as a trench region having a plurality of trenches 234 arranged thereon. In addition, the lens 230 may also be seen as having a plurality of bumps 236 arranged on the lens 230 and facing the inside of the LED. The trenches 234 are arranged on trench region fully as well in this embodiment. Therefore, although parts of light 250 are still reflected by the lens 230, the parts of light 250 are reflected to the front of the LED 200 due to the bumps 232, 236 or the trenches 234. Furthermore, because the plane region 260 has higher reflection rate than the bumpy or trench region 240 has, another parts of the light which hit the plane region 260 will be reflected to the front of the LED as well. Accordingly, the brightness of the LED is enhanced. Reference is made to FIG. 3A which is a top view of the LED 200 shown in FIG. 2. In FIG. 3A, the bumps 232 or the trenches 234 are substantially parallel to each other. In other words, the bumps 232 or the trenches 234 are substantially the same distance apart along their whole length. More specifically, the bumps 232 or the trenches 234 are arranged in a pattern of concentric circles. That is, each of the bumps 232 or the trenches 234 has a shape of circle ring, and all of the bumps 232 or the trenches 234 have substantially the same centre. However, the bumps or the trenches may also be arranged in other patterns. For example, the bumps 232 or the trenches 234 may be arranged in a pattern of beelines in another preferred embodiment (as shown in FIG. 3B). The LED according to the present invention may have a scaly and lumpy lens. Reference is made to FIG. 4A which is a top view of a LED according to another preferred embodiment of this invention. In FIG. 4A, a plurality of bumps 432 are arranged on the lens 430 of a LED 400 side by side. That is, the bumps 432 are arranged on the lens 430 next to each other. More specifically, the bumps 432 are arranged on the lens 430 in a scaly pattern. Although each of the bumps 432 shown in FIG. 4A has a convex surface, each of the bumps according to the present invention may also be other shapes. For example, each of the bumps 432 may have a shape of tetrahedron in another embodiment (shown in FIG. 4B).

From another aspect of the LED 400, the lens 430 may also be seen as having a plurality of trenches 434 arranged thereon and crisscrossing each other. More specifically, the trenches are arranged in a net pattern symmetric to its centre. That is, the trenches 434 make a symmetric pattern of straight lines that cross each other on the lens. The shapes and arrangements mentioned in this paragraph are also looked from the top of the LED 400.

Figure 5:
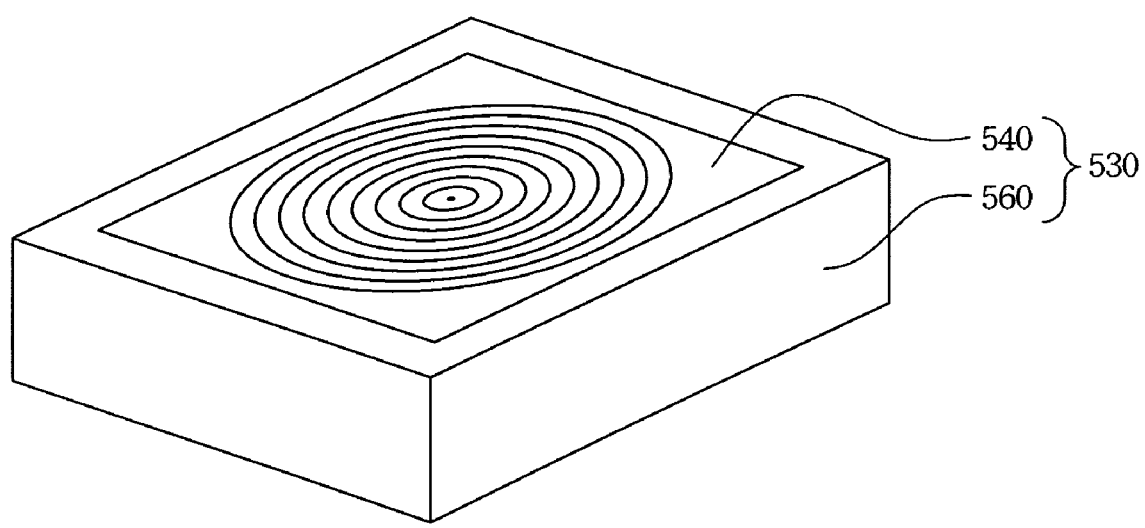
FIG. 5 is a solid diagram of a LED according to further another preferred embodiment of this invention.

Although the lens shown in FIG. 2 has a shape of round, the lens according to the present invention may also be other shapes. For example, as shown in FIG. 5, the lens 530 has a shape of rectangle in another embodiment. The lens 530 has a plane region 560 and a bumpy region 540 as well.

Although the present invention has been described in considerable detail with reference certain preferred embodiments thereof, other embodiments are possible. For example, the bumps, faces the inside of the LED, may have an arrangement on the lens opposite to the arrangement of the trenches, faces the outside of the LED. That is, the trenches on the lens looked from the top of the LED may also be seen as the bumps on the lens looked from the inside of the LED. Furthermore, the bumps, faces the inside of the LED, may also be arranged on the lens in a pattern of concentric circles or a scaly pattern. Although each of the bumps 232,236 and the trenches 234 shown in FIG. 2 has a V shaped surface, the surface of the bumps or the trenches may also be convex. Therefore, their spirit and scope of the appended claims should no be limited to the description of the preferred embodiments container herein.

The LED according to the present invention has excellent light efficiency because the lens of the LED have the bumps or trenches to reflect parts of light to the front of the LED, so the LED according to the present invention can provide higher brightness and save more power than a conventional LED. Therefore, the LED according to the present invention can be applied in many technique fields to replace traditional light sources, ex lamps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode comprising:
   a package;
   a light-emitting diode chip mounted on the package; and
   a lens mounted on the package and enveloping the light-emitting diode chip, wherein the lens comprises a bumpy region opposite the light-emitting diode chip, the bumpy region comprises a plurality of bumps arranged thereon side by side and in a scaly pattern, and each of the bumps comprises a curved surface, wherein central bumps of the bumps are higher and longer than outer bumps of the bumps, and the curved surface of each bump is a convex surface.

2. The light-emitting diode of claim 1, wherein the lens comprises a plane region adjacent to the bumpy region and surrounding the package.

3. The light-emitting diode of claim 2, wherein the vertical height of the plane region is less than about 10 mm.

4. The light-emitting diode of claim 2, wherein the plane region is positioned with an angle between the plane region and the package, and the angle is equal to or less than 90 degrees.

5. The light-emitting diode of claim 1, wherein the lens has a shape of round or rectangle.

6. A light-emitting diode having a package, a light-emitting diode chip mounted on the package and a lens mounted on the package and enveloping the light-emitting diode chip, wherein the improvement comprising:
   the lens has a plurality of bumps arranged on the lens and facing the inside of the light-emitting diode, wherein the bumps are arranged side by side and in a scaly pattern, and each of the bumps comprises a curved surface, wherein central bumps of bumps of the bumps are higher and longer than outer bumps of the bumps, and the curved surface of each bump is a convex surface.

7. The light-emitting diode of claim 6, wherein the lens has a shape of round or rectangle.

* * * * *